United States Patent [19]
Meslener

[11] 4,195,237
[45] Mar. 25, 1980

[54] UNIPOLAR TO BIPOLAR CONVERTER
[75] Inventor: George J. Meslener, Acton, Mass.
[73] Assignee: GTE Laboratories Incorporated, Waltham, Mass.
[21] Appl. No.: 904,108
[22] Filed: May 8, 1978
[51] Int. Cl.² .............................................. H03K 5/00
[52] U.S. Cl. .................................. 307/261; 307/254; 328/27; 307/247 R
[58] Field of Search ....................... 307/247, 261, 254; 328/27

[56] References Cited
U.S. PATENT DOCUMENTS

| 4,034,236 | 7/1977 | Aveneau et al. | 307/247 |
| 4,121,118 | 10/1978 | Miyazaki | 307/262 |

Primary Examiner—Stanley D. Miller, Jr.
Assistant Examiner—B. P. Davis
Attorney, Agent, or Firm—Fred Fisher

[57] ABSTRACT

A unipolar to bipolar converter includes a source of unipolar data pulses and of noise pulses. Each data pulse has a pulse width in excess of a time duration t. Each noise pulse has a pulse width less than the time duration t. A one-shot multivibrator, with an input coupled to the source, normally provides a first output signal indicative of one binary state. The multivibrator switches to a second binary output state for the time duration t when the multivibrator receives the leading edge of one of the pulses (data or noise). A flip-flop, coupled to receive the output signals of the one-shot multi-vibrator, and further adapted to receive the source pulses, provides a first output signal at one fixed binary state upon the simultaneous presence of one of the source pulses and the first output signal from the one-shot multivibrator. Otherwise, the flip-flop provides a second output signal at the opposite fixed binary state. A second one-shot multivibrator, coupled to receive the output signals from the first flip-flop, normally provides a first output signal indicative of one binary state. The second one-shot multivibrator switches to a second output signal indicative of the other binary state for a time duration $t_1$ (which is not necessarily the same as the time duration t) when it receives the trailing edge of the first output signal from the first flip-flop. A second flip-flop coupled to receive the output signals from the second one-shot multivibrator, provides alternate output signals indicative of the two binary states. The second flip-flop switches state upon receipt of the trailing edge of the second one-shot multivibrator second output signal. The second flip-flop and the source pulses control means for providing an output signal which corresponds to the alternate switching of the polarity of the source pulses, dependent upon the state of the second flip-flop alternate output signals.

6 Claims, 5 Drawing Figures

UNIPOLAR TO BIPOLAR CONVERTER

BACKGROUND OF THE INVENTION

1. Field of the Invention

This invention relates to electrical converters and, in particular, to unipolar to bipolar converters. Accordingly, it is a general object of this invention to provide new and improved converters of such character.

2. Description of the Prior Art

Bipolar signals are suitable for use in electrical communication. A common form of bipolar data signals consists of return-to-zero pulses wherein each pulse represents a binary one. The binary one pulses alternate in polarity. A binary zero is represented by the absence of a pulse. A system of return-to-zero pulses is advantageous because timing signals can be simply recovered. The alternating pulse feature is desirable for two reasons: First, the data signal contains no dc component and can be ac coupled with no degradation or loss of energy. Second, the alternating pulse feature provides for automatic error detection. Thus, bipolar transmission is in common use in the electrical telecommunications industry.

In optical communication systems, unipolar transmission is far more desirable than bipolar. In optical communication systems, a binary zero is represented by the absence of light, whereas a binary one is represented by the presence of a light pulse. In present systems, when optical transmission links are used to carry telecommunication signals, the bipolar data signals are converted to unipolar form, transmitted over the optical link, then converted back to bipolar form. Conversion from bipolar to unipolar is relatively simple, while the reverse is usually more difficult.

One method, in the prior art, for converting unipolar pulses to bipolar pulses was to simply apply the unipolar signal to a binary divider which changes state each time a unipolar pulse is present. As the binary divider toggles, the unipolar pulses are alternately inverted, producing a bipolar signal. The major problem with such a prior art method was that very narrow noise pulses, which often occur at the leading and trailing edges of the unipolar pulse, tend to cause the binary divider to toggle twice per unipolar pulse, instead of once. By toggling twice, the binary divider returns to its original position, and the data pulses do not alternate in polarity.

To eliminate false triggering of the binary divider by narrow noise pulses, a timing signal can be derived from the unipolar pulse stream which can be used to sample the pulse stream. Each sample pulse causes the binary divider to toggle as before. However, narrow noise spikes occurring at the leading and trailing edges of the unipolar pulses are eliminated, preventing multiple triggering of the binary divider. Such a method is effective, but requires clock recovery circuits which might not otherwise be required.

SUMMARY OF THE INVENTION

It is yet another object of this invention to provide a new and improved unipolar to bipolar converter that does not require a clock recovery circuit.

Still another object of this invention is to provide a new and improved unipolar to bipolar converter that does not respond to narrow pulses anywhere in the pulse train.

In accordance with a preferred embodiment of this invention, a unipolar to bipolar converter includes a source of unipolar data pulses and of noise pulses. Each data pulse has a pulse width in excess of a time duration t. Each noise pulse has a pulse width less than the time duraton t. A one-shot multivibrator, with an input coupled to the source, normally provides a first output signal indicative of one binary state. The multivibtator switches to a second binary output state for the time duration t when the multivibrator receives the leading edge of one of the pulses (data or noise). A flip-flop, coupled to receive the output signals of the one-shot multivibrator, and further adapted to receive the source pulses, provides a first output signal at one fixed binary state upon the simultaneous presence of one of the source pulses and the first output signal from the one-shot multivibrator. Otherwise, the flip-flop provides a second output signal at the opposite fixed binary state. A second one-shot multivibrator, coupled to receive the output signals from the first flip-flop, normally provides a first output signal indicative of one binary state. The second one-shot multivibrator switches to a second output signal indicative of the other binary state for a time duration $t_1$ (which is not necessarily the same as the time duration t) when it receives the trailing edge of the first output signal from the first flip-flop. A second flip-flop coupled to receive the output signals from the second one-shot multivibrator, provides alternate output signals indicative of the two binary states. The second flip-flop switches state upon receipt of the trailing edge of the second one-shot multivibrator second output signal. The second flip-flop and the source pulses control means for providing an output signal which corresponds to the alternate switching of the polarity of the source pulses, dependent upon the state of the second flip-flop alternate output signals.

BRIEF DESCRIPTION OF THE DRAWINGS

Other objects, advantages and features of this invention, together with its construction and mode of operation, will become more apparent from the following description, when read in conjunction with the accompanying drawings, in which:

FIG. 3 is a schematic diagram of another embodiment of the invention;

DESCRIPTION OF A PREFERRED EMBODIMENT

Figure 1:
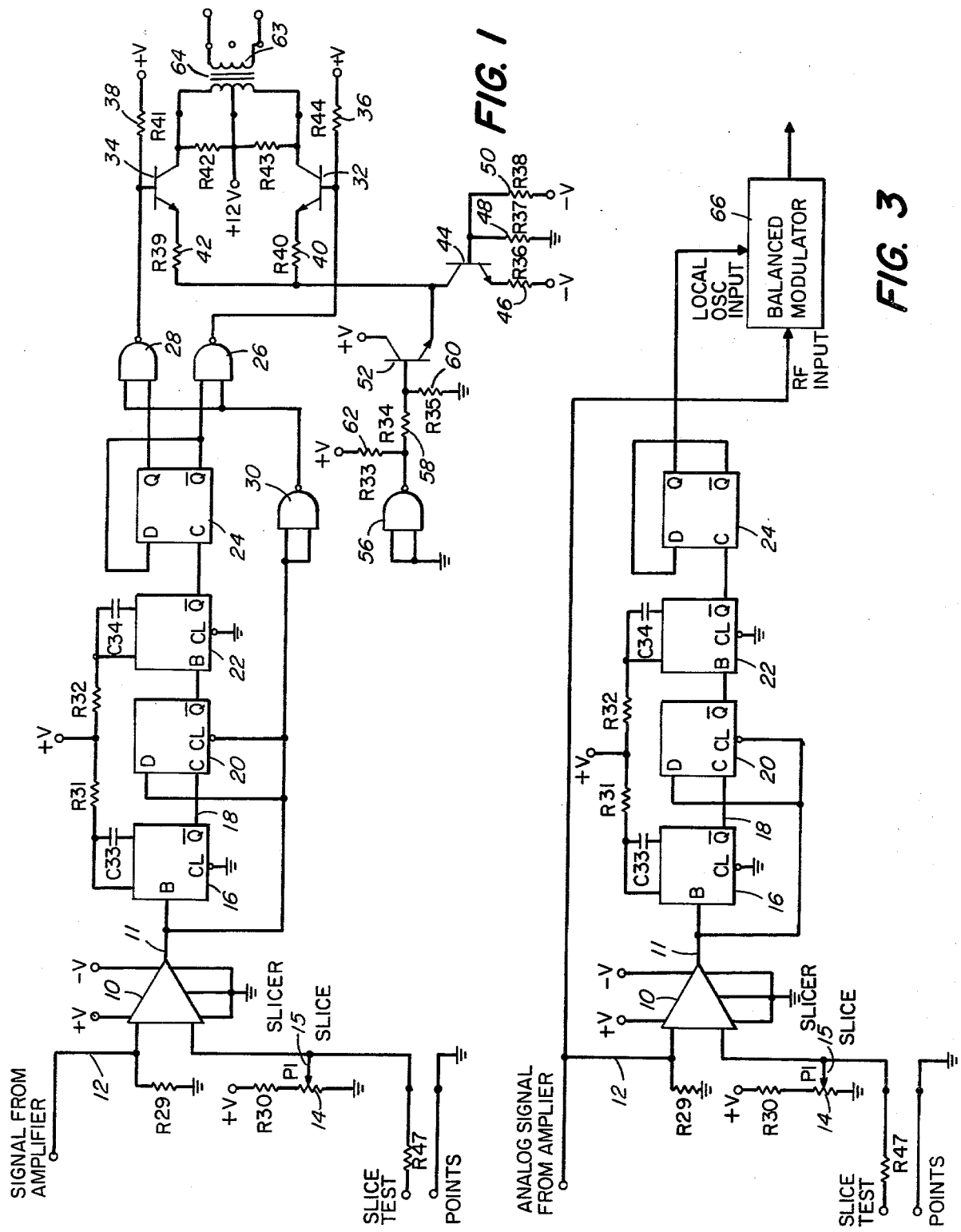
FIG. 1 is a schematic diagram of one embodiment of this invention.
Figure 2:
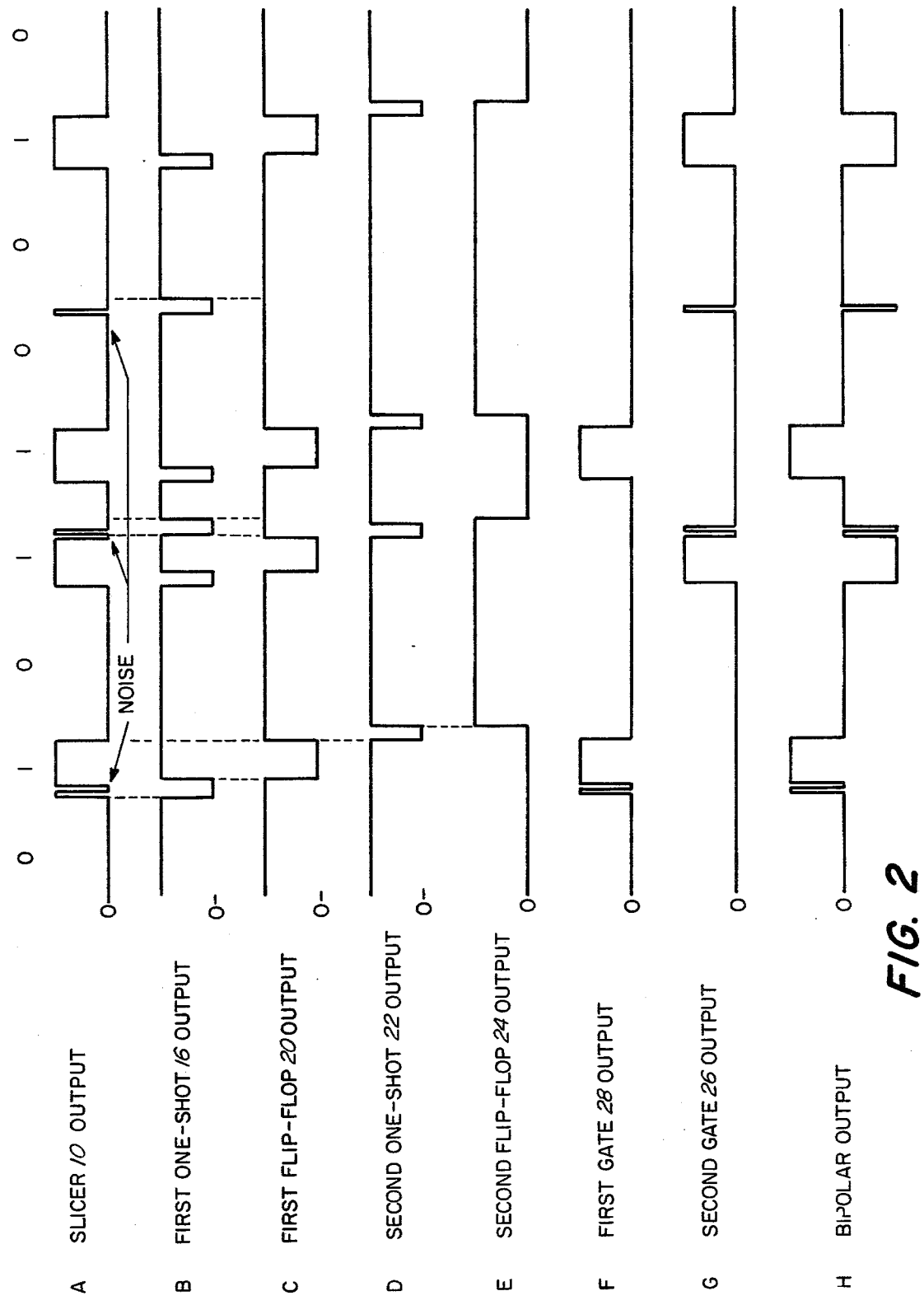
FIG. 2 is a timing diagram of the embodiment shown in FIG. 1.

FIGS. 1 and 2 illustrate a schematic diagram and a timing diagram, respectively, of a unipolar to bipolar converter in accordance with a preferred embodiment of the invention.

The unipolar signals, which are optically transmitted, are filtered, amplified, and re-filtered by a receiver (not shown), and applied to the circuit shown in FIG. 1. Thus, the optical data signals are converted into filtered, amplified data pulses.

Referring to FIG. 1, there is depicted a slicer or line receiver 10 having an output line 11 and an input line 12 which is adapted to receive the filtered amplified data pulses from the filter/amplifier receiver. A variable rheostat 14, having one end thereof coupled to a positive potential, and the other end thereof coupled to ground, has its arms 15 coupled to another input of the line receiver 10. The rheostat 14 is a control which sets the threshold level of the slicer or line receiver 10 and is adjusted, preferably, halfway between the two extremes at which bit errors occur when using a bit error test set. The test set should be one that makes a bit to bit comparison and not one that only detects bipolar violations.

The output line 11 is coupled to the input of a one-shot multivibrator 16 having its $\overline{Q}$ output 18 coupled to one input of a flip-flop 20. The other input of the flip-flop 20 is coupled to the output line 11 of the line receiver 10. The output line 11 of the line receiver 10 is also coupled to the clear terminal of the flip-flop 20.

The $\overline{Q}$ output of the flip-flop 20 is coupled to the input of a second one-shot multivibrator 22. Its clear terminal is coupled to a point of reference potential, such as ground. The Q output from the second one-shot multivibrator 22 is coupled to one input of a second flip-flop 24. The $\overline{Q}$ output from the second flip-flop 24 is coupled to the other input of the flip-flop 24.

The $\overline{Q}$ output from the flip-flop 24 is coupled to one input of an AND gate 26. The Q output from the second flip-flop 24 is coupled to one input of an AND gate 28.

The output line 11 from the line receiver 10 is coupled through an inverter 30 to the other inputs of the AND gates 26, 28.

The output from the AND gate 26 is coupled to the base of a p-type transistor 32. The output from the AND gate 28 is coupled to the base of a p-type transistor 34. The base of the p-type transistor 32 is coupled through a resistor 36 to a source of positive potential. The base of the transistor 34 is coupled through a resistor 38 to a source of positive potential. The emitters of the transistors 32, 34 are coupled to the collector of a p-type transistor 44 via resistors 40 and 42, respectively. The emitter of the transistor 44 is coupled via a resistor 46 to a source of negative potential. The base of the transistor 44 is coupled via a resistor 48 to a point of reference potential, such as ground. The base of the transistor 44 is also coupled via a resistor 50 to a source of negative potential. The collector of the transistor 44 is coupled to the emitter of a p-type transistor 52 whose collector is coupled to a source of positive potential.

A source of reference potential, such as ground, is coupled to both inputs of an inverter 56 whose output is coupled via a resistor 58 to the base of the transistor 52. The base of the transistor 52 has one resistor 60 coupled to a point-of reference potential, such as ground, and another resistor 62 coupled to a source of positive potential.

Referring to FIG. 2, when the slicer or line receiver 10 output becomes positive (see FIG. 2A), the first one-shot multivibrator 16 is triggered and the clear input to the first flip-flop 20 becomes high. The $\overline{Q}$ output of the one-shot multivibrator 16 decreases to ground potential (see FIG. 2B) and, after approximately 75 ns (or a fixed period of time duration t), returns to its positive state which causes the $\overline{Q}$ output of the first flip-flop 20 to become the complement of the signal appearing at its other input terminal (but only when the clear input is high). The $\overline{Q}$ output of the flip-flop 20 is negative going (i.e., at ground potential) only when a binary one is present together with a positive clear signal; it returns positive when the clear input returns to ground.

The positive going trailing edge of the output of the first flip-flop 20 (see FIG. 2C) triggers the second one-shot multivibrator 22, which, after a 75 ns delay, causes the flip-flop 24 to toggle (i.e., trigger). Such a delay prevents toggling during a data pulse which would otherwise chop up the pulse. The outputs of the flip-flop 24 control two gates 26, 28 whose outputs alternately turn on output transistors 32, 34 when data pulses are present. Note that narrow noise pulses appearing at the leading and trailing edges of data pulses, as well as those appearing between data signals, do not toggle the flip-flops but still appear at the output.

As shown in FIG. 2, the positive going trailing edge of the output of the first flip-flop 20 (FIG. 2C) causes the second one-shot multivibrator 22 to be triggered for a 75 ns time period. Hence, as shown in FIG. 2D, the output of the second one-shot multivibrator 22 drops from a positive level to zero level when the first flip-flop output 20 becomes positive going. The second one-shot multivibrator 22 remains at that level for a 75 ns time period, and then becomes positive going until the next positive going trailing edge of the output of the first flip-flop 20.

The positive going trailing edge of the output of the second one-shot multivibrator 22 (FIG. 2D) causes the second flip-flop 24 to change state (see FIG. 2E).

The alternating states of the second flip-flop 24 causes the gates 32 and 34 to alternately open so that the first gate 28 is open when the second flip-flop 24 $\overline{Q}$ output is at a zero condition; the second gate 26 is open when the second flip-flop 24 $\overline{Q}$ output is at its positive condition (see FIGS. 2F and 2G, respectively). The bipolar output appears across the output winding 63 of the transformer 64 whose primary winding is coupled across the collectors of the transistors 32, 34, as shown in FIG. 2H.

In summary, FIG. 2A shows the unipolar pulse stream including data and noise, after filtering and amplification. The positive going edge of a unipolar pulse triggers the first one-shot multivibrator 16 (FIG. 2B), producing a pulse lasting approximately one-third of a return-to-zero pulse width. The trailing or positive going edge of the output of the first multivibrator 16 samples the unipolar pulse which triggers the first flip-flop 20 when a wide data pulse is present. It is noted that the first flip-flop 20 does not trigger when only a narrow noise pulse is present, since there is no pulse present at the trailing edge of the one-shot multivibrator 16.

The first flip-flop 20 is cleared, returning to its normal position when the unipolar pulse returns to ground, triggering the second one-shot multivibrator 22. The output of the second one-shot multivibrator 22 becomes positive after a delay of approximately one-third of a return-to-zero pulse interval, triggering the second flip-flop 24. The second flip-flop 24 controls two gates 26, 28 which alternately pass the unipolar pulses. These gates 26, 28 alternately cause the transistors 32, 34 to conduct, producing the bipolar pattern to appear across the transformer winding 63. Note that unipolar data pulses plus noise pulses appear undistorted across the output winding 63 (FIG. 2H). No information is lost nor are pulses altered by the conversion from unipolar to bipolar form. It is further noted that no clock recovery is required nor do noise pulses affect the conversion.

The output stage of the unit depicted in FIG. 1 contains a constant current transistor 44, two current switches 32, 34, and a current sink 52. When a positive pulse appears at the base of the transistor 34, it conducts, allowing all of the current generated in the transistor 44 to pass through one side of the primary winding of the transformer 64 to produce a positive pulse at the output 63. A positive pulse at the base of the transistor 32 causes it to pass the current through the other side of the primary of the transistor 64 to produce a negative pulse. With no pulses present, the transistor 52 carries all the current and no output pulse is produced.

Values of resistances, transformers, and etc., can be as follows:

| R29 | 330 ohms | R42 | 200 ohms |
|---|---|---|---|
| R30 | 470 ohms | R43 | 200 ohms |
| P1 | 500 ohms | R44 | 1 kilohm |
| R47 | 1 kilohm | R33 | 1 kilohm |
| R31 | 2.2 kilohm | R34 | 470 ohms |
| R32 | 2.2 kilohm | R35 | 470 ohms |
| R41 | 1 kilohm | R36 | 47 ohms |
| R39 | 47 ohms | R37 | 120 ohms |
| R40 | 47 ohms | R38 | 300 ohms |
| C33 | 47pf | | |
| C34 | 47 pf | | |

DESCRIPTION OF AN ALTERNATE EMBODIMENT

Figure 4:
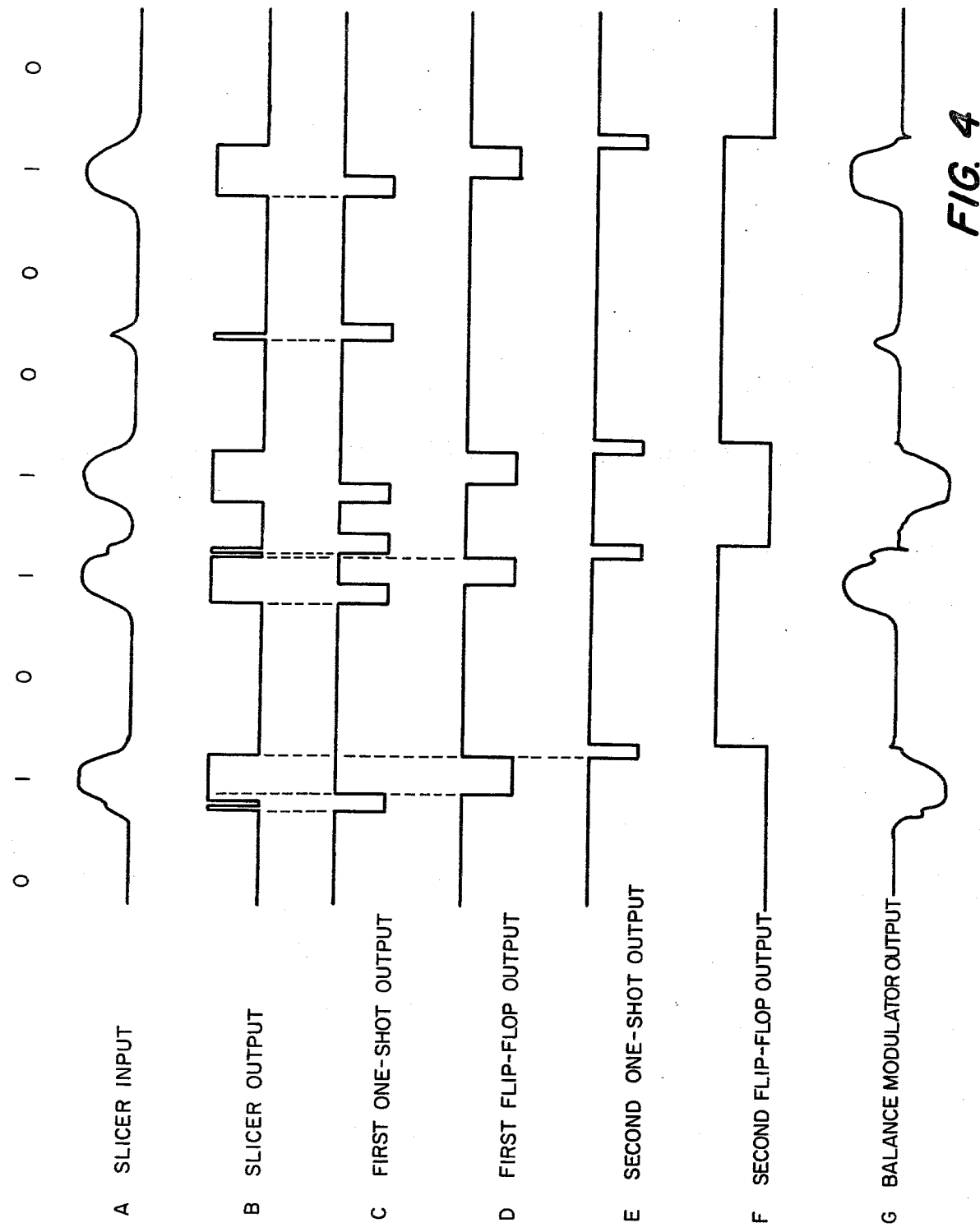
FIG. 4 is a timing diagram of the embodiment shown in FIG. 3.

Referring to FIGS. 3 and 4, there is depicted an alternate embodiment in which similar reference numerals correspond to similar components.

The alternate embodiment, as shown in FIG. 3, utilizes a balanced modulator 66 in lieu of the gates 26, 28, output transistors 32, 34, and the transformer 64. Unipolar analog signals (FIG. 4A) at the slicer input on the line 12 can be converted to bipolar form. The slice input signal is fed to one input of the balanced modulator 66 (FIG. 3) and the output of the second flip-flop 24 is coupled to the other input of the balanced modulator 66.

Figure 5:
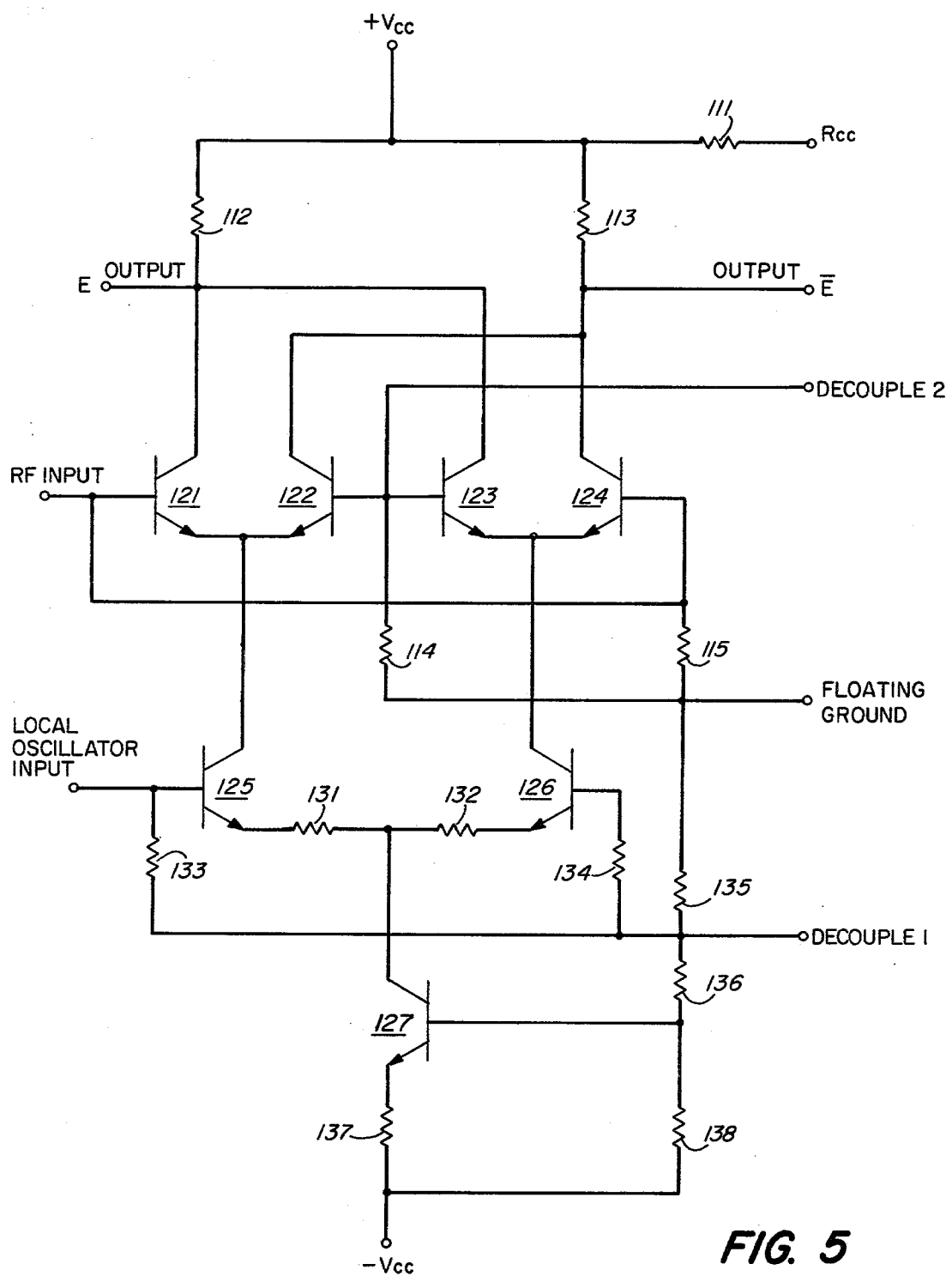
FIG. 5 is a schematic diagram of a balanced modulator circuit, suitable for use in the embodiment of FIG. 3.

In this embodiment, the analog signal itself is converted to a bipolar signal. The balanced modulator 66 can be Texas Instrument Linear Integrated Circuit type SN 76514 or Motorola MC 1596. Using the Texas Instrument device as a balanced modulator, the input of the slicer signal is coupled to the RF input of the SN 76514 (FIG. 5). The output from the second flip-flop is connected to the local oscillator input of the SN 76514. The operation is as follows: When the second flip-flop 24 output is positive, transistor 125 (see FIG. 5) turns on, enabling differential pair transistors 121 and 122. The transistor 126 turns off, disabling the differential pair 123 and 124. With the slicer input connected to the RF input of the SN 76514, the inverted analog signal appears at the collector of the transistor 121, at the output E, and the noninverted signal at the collector of the transistor 122 (the output $\overline{E}$, which is shown as a balanced modulator output at FIG. 3). When the second flip-flop 24 output is low, the transistor 125 turns off and the transistor 126 turns on, disabling the pair of transistors 121 and 122, and enabling the pair of transistors 123 and 124. The slicer input is connected to the base of the transistor 124, and the inverted pulse appears at the balanced modulator output (output $\overline{E}$). In such a manner, the analog pulses alternate in polarity, and resemble a true bipolar pulse as they appear on a wire transmission line.

The advantage of gating out analog signals, as opposed to digitized signals (slicer output), is performance. Once a data signal has been sliced, optimum pulse detection techniques do not improve performance since slicing is a nonlinear process producing in-band, cross modulation products between the data signal and out-of-band noise. Matched filter or true correlation detection requires the complete analog signals. Values of various resistances are given below:

| 111 | 3 kilohm |
|---|---|
| 112 | 600 ohms |
| 113 | 600 ohms |
| 114 | 600 ohms |
| 115 | 600 ohms |
| 131 | 20 ohms |
| 132 | 20 ohms |
| 133 | 50 ohms |
| 134 | 50 ohms |
| 135 | 1 kilohm |
| 136 | 1.05 kilohms |
| 137 | 215 ohms |
| 138 | 1.1 kilohms |

What is claimed is:

1. A unipolar to bipolar converter comprising:
    a source of unipolar data pulses each having a pulse width in excess of a time duration t and of noise pulses each having a pulse width less than said time duration t;
    first one-shot multivibrator means having an input coupled to said source, said means normally providing a first output signal therefrom indicative of one binary state and switching to a second output signal therefrom indicative of the other binary state for said time duration t when said means receives the leading edge of one of said pulses;
    first flip-flop means having an input coupled to receive the output signals of said first one-shot multivibrator means, and being coupled to receive said pulses from said source, said flip-flop means providing a first output signal of one fixed binary state upon the simultaneous presence of one of said source pulses and said first one-shot multivibrator means one binary state output signal, said flip-flop means otherwise providing a second output signal of the opposite fixed binary state;
    second one-shot multivibrator means having an input coupled to receive the output signals from said first flip-flop means, said second one-shot multivibrator means normally providing a first output signal therefrom indicative of one binary state and switching to a second output signal therefrom indicative of the other binary state for a time duration $t_1$ when said second one-shot multivibrator means receives the trailing edge of said first flip-flop means first output signal;
    second flip-flop means having an input coupled to receive the output signals of said second one-shot multivibrator means, said second flip-flop means providing alternate output signals indicative of two binary state, said second flip-flop means changing from one state to another upon the receipt of the trailing edge of said second one-shot multivibrator means second output signal; and
    means controlled by said second flip-flop means and said source for providing an output signal which corresponds to the alternate switching of the polarity of said source pulses dependent upon the state of said second flip-flop means alternate output signals.

2. The converter as recited in claim 1, wherein $t = t_1$.

3. The converter as recited in claim 1, wherein said last named means comprises a balanced modulator.

4. The converter as recited in claim 3, wherein $t=t_1$.

5. The converter as recited in claim 1, wherein said second flip-flop means includes a first output line for providing said alternate output signals and includes a second output line for providing output signals indicative of a binary state opposite to the carried on said first output line; and wherein said controlled means comprises:

a first output transistor;

a second output transistor;

a first gate having one input coupled to said source and a second input coupled to said second flip-flop means first output line for alternately turning on said first output transistor when data pulses are present;

a second gate having one input coupled to said source and a second input coupled to said second flip-flop means second output line for alternately turning on said second output transistor when data pulses are present; and a transformer having a primary winding coupled across said output transistors, and having an output winding.

6. The converter as recited in claim 5 further comprising:

constant current transistor means coupled to said output transistors;

current synchronizing means coupled to said output transistors, whereby when said second flip-flop means provides a positive pulse to said first output transistor, said first output transistor conducts, allowing all of the current generated in said constant current transistor means to pass through one side of said primary winding to produce a positive pulse at said bipolar output, and whereby when said second flip-flop means provides a positive pulse to said second output transistor, said second output transistor conducts, allowing all of the current generated in said constant current transistor means to pass through the other side of said primary winding to produce a negative pulse at said bipolar output, and whereby with no pulses present, said current synchronizing means carries all of the current and no output pulse is produced.

* * * * *